United States Patent
Oh et al.

(10) Patent No.: US 11,706,946 B2
(45) Date of Patent: Jul. 18, 2023

(54) STRETCHABLE DISPLAY DEVICE

(71) Applicant: Electronics and Telecommunications Research Institute, Daejeon (KR)

(72) Inventors: Ji-Young Oh, Daejeon (KR); Himchan Oh, Sejong-si (KR); Chul Woong Joo, Sejong-si (KR); Seung Youl Kang, Daejeon (KR); Chan Woo Park, Daejeon (KR); Seongdeok Ahn, Daejeon (KR); Jae-Eun Pi, Sejong-si (KR); Chi-Sun Hwang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 303 days.

(21) Appl. No.: 17/191,276

(22) Filed: Mar. 3, 2021

(65) Prior Publication Data
US 2021/0280827 A1    Sep. 9, 2021

(30) Foreign Application Priority Data

Mar. 3, 2020   (KR) .................. 10-2020-0026483
Mar. 2, 2021   (KR) .................. 10-2021-0027713

(51) Int. Cl.
*H01L 21/00* (2006.01)
*H10K 50/844* (2023.01)
(Continued)

(52) U.S. Cl.
CPC ......... *H10K 50/844* (2023.02); *H10K 77/111* (2023.02); *H10K 85/324* (2023.02);
(Continued)

(58) Field of Classification Search
CPC .................................................. H10K 50/844
See application file for complete search history.

(56) References Cited

U.S. PATENT DOCUMENTS 9,065,054 B2   6/2015  Voronov et al.
9,177,821 B2   11/2015 Jung et al.
(Continued)

FOREIGN PATENT DOCUMENTS

KR   1020120042022 A   5/2012
KR   1020140069443 A   6/2014
(Continued)

*Primary Examiner* — Douglas M Menz
(74) *Attorney, Agent, or Firm* — William Park & Associates Ltd.

(57) ABSTRACT

Provided is a stretchable display device. The stretchable display device includes a substrate and a base pattern on the substrate, wherein the base pattern comprises a first portion, a second portion, and a connection portion configured to connect the first portion to the second portion. The stretchable display device includes a lower electrode on the first portion of the base pattern; an upper electrode on the lower electrode, a light emitting structure between the lower electrode and the upper electrode, and a protective layer configured to cover top and side surfaces of the upper electrode, side surfaces of the light emitting structure, a side surface of the lower electrode, and a portion of a side surface of the base pattern. The upper electrode extends to a top surface of the connection portion and a top surface of the second portion of the base pattern, and the first portion and the second portion of the base pattern extend in a first direction parallel to a top surface of the substrate. The first portion and the second portion are parallel to the top surface of the substrate and are spaced apart from each other in a second direction crossing the first direction. The connection portion extends in the second direction. A level of the lowermost surface of the protective layer is disposed between a bottom surface of the lower electrode and a bottom surface of the base pattern.

20 Claims, 21 Drawing Sheets

(51) Int. Cl.
  *H10K 77/10* (2023.01)
  *H10K 85/30* (2023.01)
  *H10K 85/60* (2023.01)
  *H10K 50/15* (2023.01)
  *H10K 50/16* (2023.01)
(52) U.S. Cl.
  CPC ......... *H10K 85/615* (2023.02); *H10K 85/654* (2023.02); *H10K 85/6565* (2023.02); *H10K 85/6572* (2023.02); *H10K 50/15* (2023.02); *H10K 50/16* (2023.02)

(56) References Cited

U.S. PATENT DOCUMENTS

| | | | |
|---|---|---|---|
| 10,176,903 B2 * | 1/2019 | Sekitani | ................ H10K 71/15 |
| 11,011,599 B2 | 5/2021 | Kim et al. | |
| 2016/0043321 A1 | 2/2016 | Kwon | |
| 2017/0047558 A1 | 2/2017 | Lee et al. | |
| 2017/0207410 A1 | 7/2017 | Cho et al. | |
| 2017/0343879 A1 * | 11/2017 | Harris | ..................... B32B 27/36 |
| 2018/0046221 A1 * | 2/2018 | Choi | ..................... G06F 1/1637 |
| 2020/0006684 A1 * | 1/2020 | Liu | ........................ H10K 71/00 |
| 2020/0119294 A1 * | 4/2020 | Kim | ....................... H10K 59/12 |
| 2020/0203608 A1 | 6/2020 | Jang et al. | |
| 2020/0410909 A1 * | 12/2020 | Jung | ....................... G09F 9/301 |
| 2021/0064091 A1 * | 3/2021 | Wang | ..................... G09F 9/301 |
| 2021/0141124 A1 * | 5/2021 | Park | ..................... H05K 5/0226 |

FOREIGN PATENT DOCUMENTS

| | | |
|---|---|---|
| KR | 1020140117998 A | 10/2014 |
| KR | 1020140121325 A | 10/2014 |
| KR | 1020150061159 A | 6/2015 |
| KR | 1020160018925 A | 2/2016 |
| KR | 101939462 B1 | 1/2019 |
| KR | 1020200012255 A | 2/2020 |

* cited by examiner

FIG. 1C
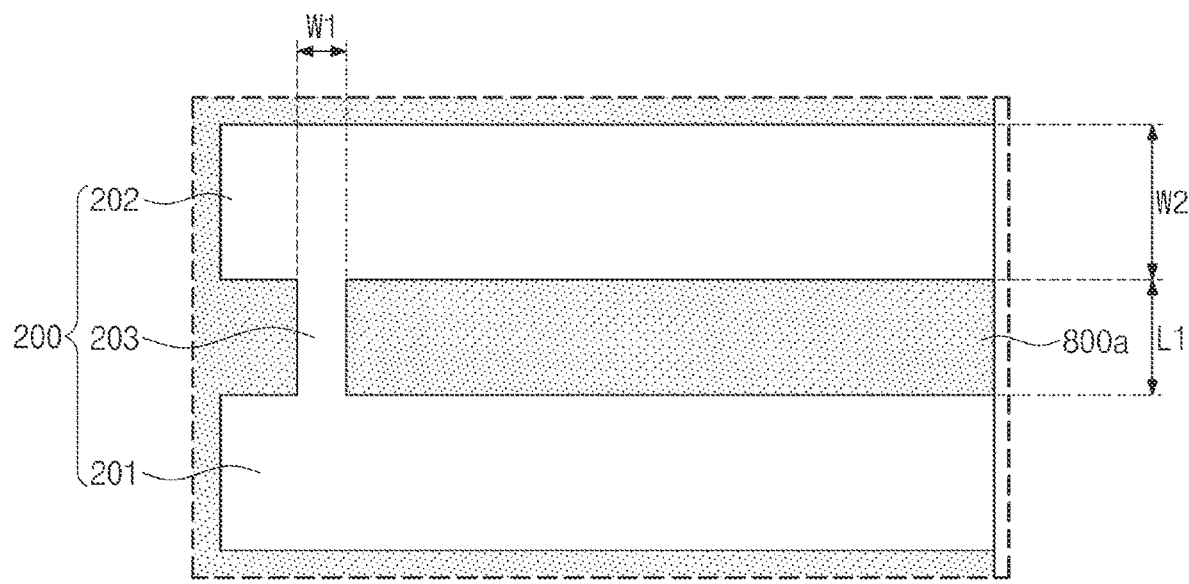
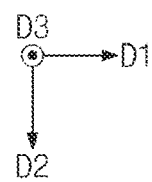

FIG. 2A
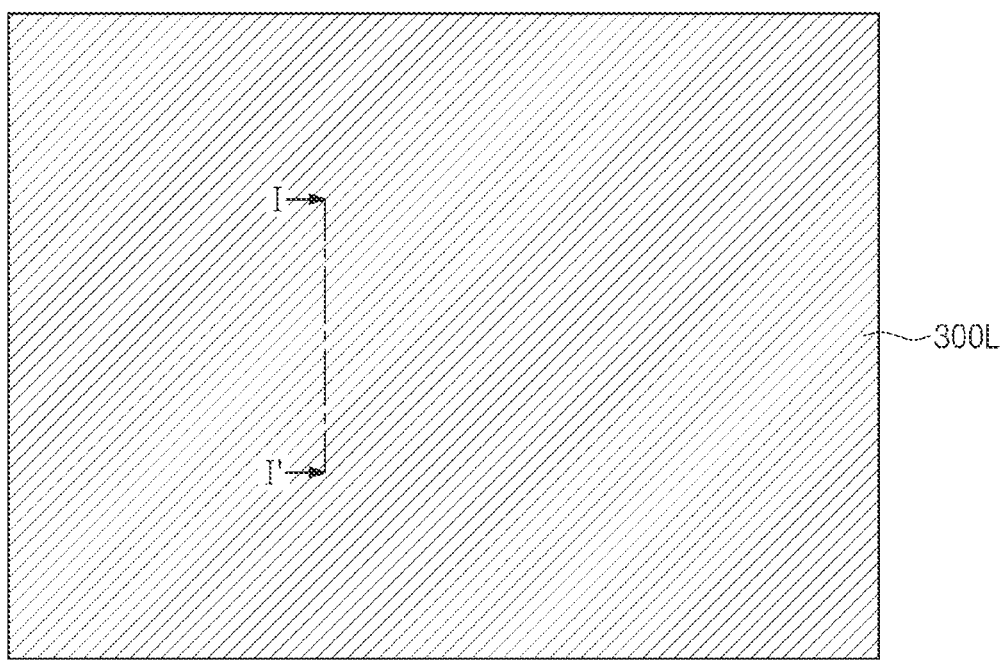
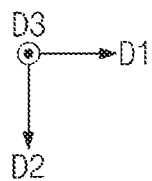

FIG. 2B
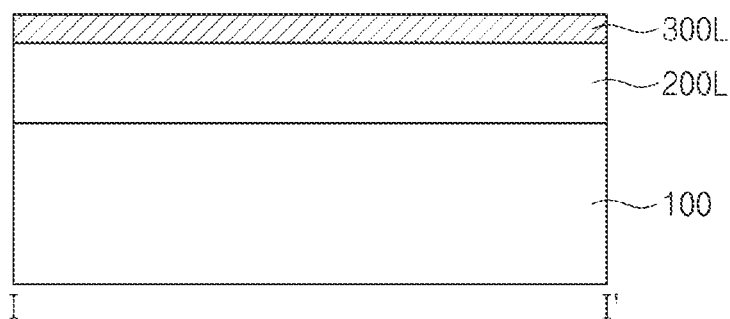
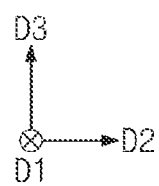

FIG. 3A
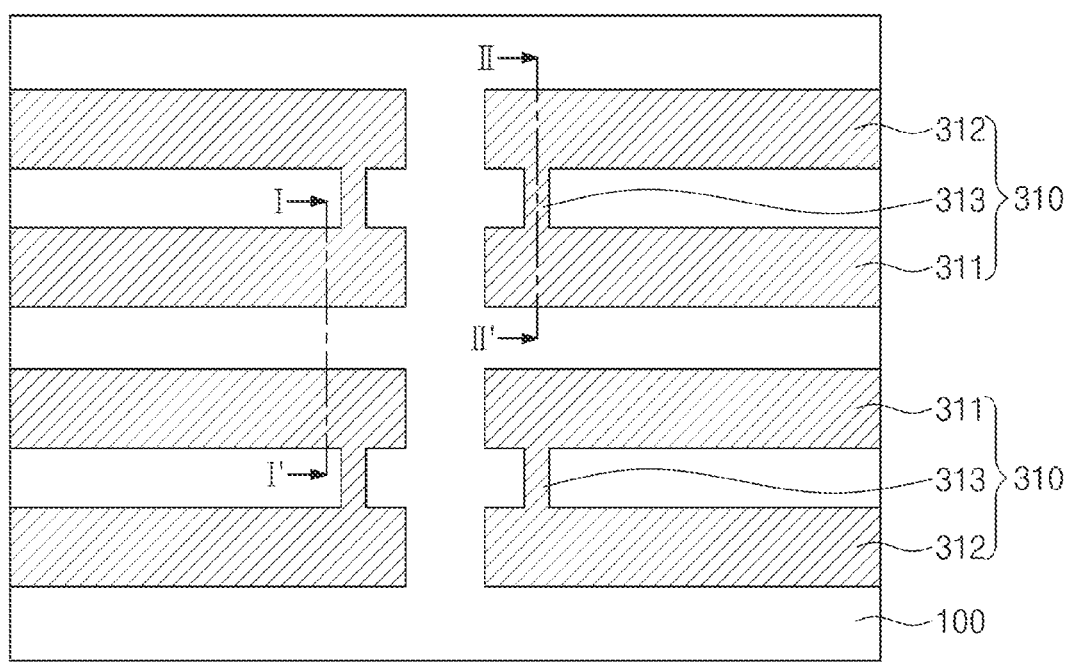
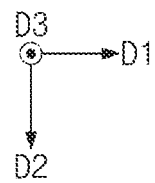

FIG. 4A
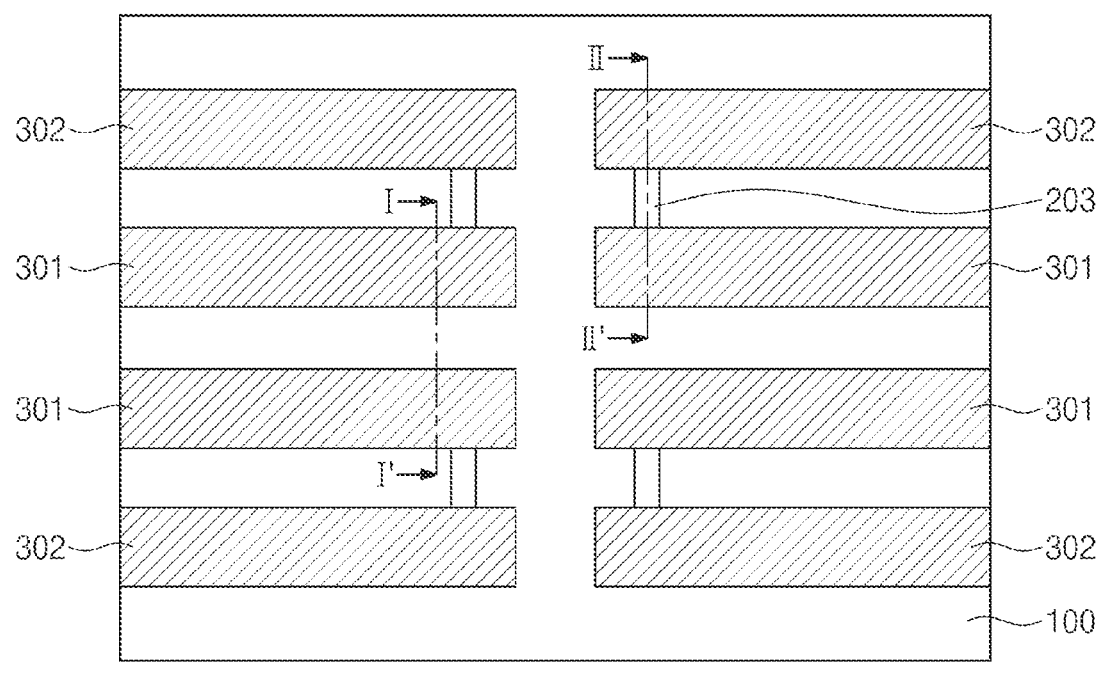
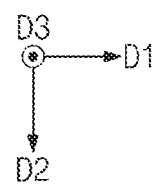

FIG. 5A
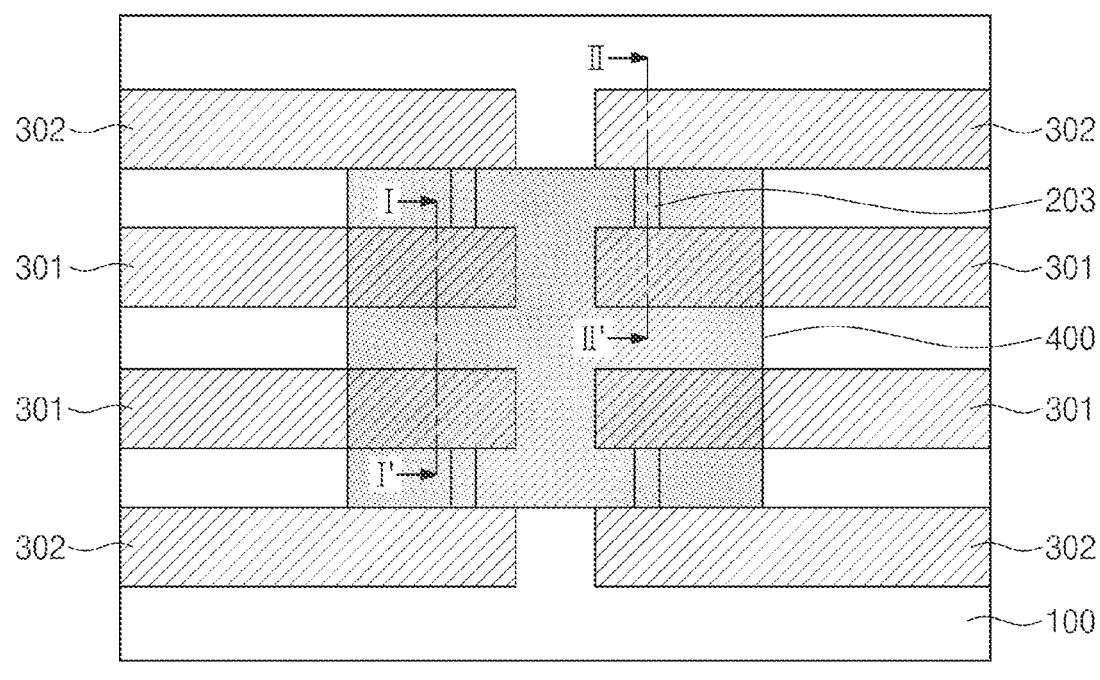
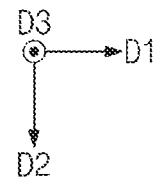

FIG. 12B
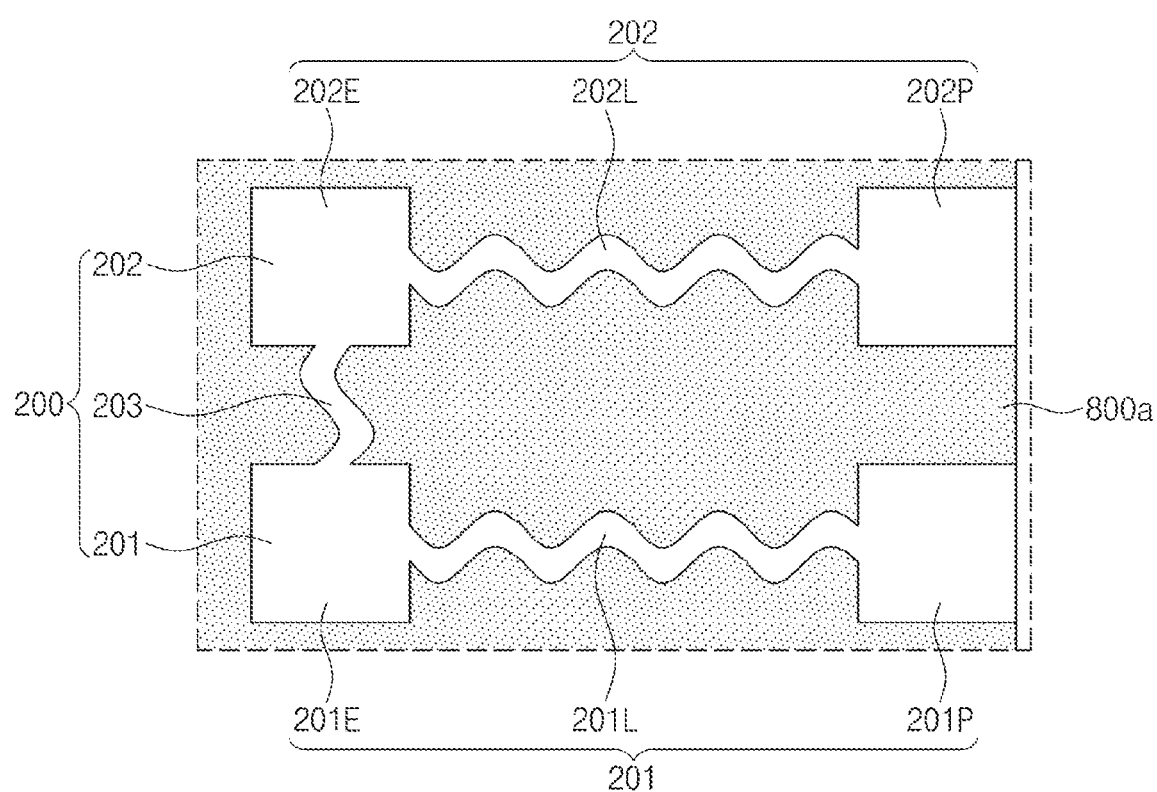
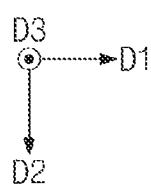

STRETCHABLE DISPLAY DEVICE

CROSS-REFERENCE TO RELATED APPLICATIONS

This U.S. non-provisional patent application claims priority under 35 U.S.C. § 119 of Korean Patent Application No. 10-2020-0026483, filed on Mar. 3, 2020, and Korean Patent Application No. 10-2021-0027713, filed on Mar. 2, 2021, the entire contents of which are hereby incorporated by reference.

BACKGROUND

The present disclosure relates to a stretchable display device.

Unlike glass, a substrate such as plastic has advantages of being lightweight and resistant to impact, so it is not easily broken, being attached to a curved surface, and ultimately being rollable and foldable. Accordingly, if a display device is manufactured on such a substrate, since the existing large-area screen is rolled to be reduced in volume, is not easily broken even if dropped, and is lightweight, the display device may be used as a portable display. In addition, since the display device is capable of being designed to match an installation surface and an attachment surface at any place desired by a user, the display device may be used at a great variety of places compared to the existing glass-based display device.

Studies are being conducted to form smaller and more uniform patterns of lines of an electronic devices on a substrate. A method for forming fine patterns includes printing, lithography, micro contact printing, laser assisted pattern transfer (LIFT), laser direct patterning, and the like.

SUMMARY

The present disclosure provide a stretchable display device having improved reliability and transmittance.

An embodiment of the inventive concept provides a stretchable display device including: a substrate; and a base pattern on the substrate, wherein the base pattern comprises a first portion, a second portion, and a connection portion configured to connect the first portion to the second portion; a lower electrode on the first portion of the base pattern; an upper electrode on the lower electrode; a light emitting structure between the lower electrode and the upper electrode; and a protective layer configured to cover top and side surfaces of the upper electrode, side surfaces of the light emitting structure, a side surface of the lower electrode, and a portion of a side surface of the base pattern, wherein the upper electrode extends to a top surface of the connection portion and a top surface of the second portion of the base pattern.

The first portion and the second portion of the base pattern extend in a first direction parallel to a top surface of the substrate, the first portion and the second portion are parallel to the top surface of the substrate and are spaced apart from each other in a second direction crossing the first direction, the connection portion extends in the second direction, and a level of the lowermost surface of the protective layer is disposed between a bottom surface of the lower electrode and a bottom surface of the base pattern.

In an embodiment of the inventive concept, a stretchable display device includes: a substrate; a base pattern on the substrate, wherein the base pattern comprises a first portion, a second portion, and a connection portion configured to connect the first portion to the second portion; and a light emitting element on the base pattern, wherein the light emitting element includes: a first lower conductive pattern on the first portion of the base pattern; a second lower conductive pattern on the second portion of the base pattern; a light emitting structure on the first lower conductive pattern; an upper conductive pattern on the first lower conductive pattern and a protective layer configured to cover the light emitting element, wherein the upper conductive pattern extends onto the connection portion and the second portion of the base pattern, and the protective layer has a shape that is segmented between the first portion and the second portion of the base pattern.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 1C is a schematic plan view illustrating a base pattern of FIG. 1A;

FIGS. 2A to 7A are plan views illustrating a process of manufacturing a stretchable display device according to some embodiments of the inventive concept;

FIGS. 2B to 7B are cross-sectional views taken along line I-I' and II-II' of FIGS. 2A to 7A;

FIG. 12B is a schematic plan view illustrating a base pattern of FIG. 12A.

DETAILED DESCRIPTION

Embodiments of the present invention will be described with reference to the accompanying drawings so as to sufficiently understand constitutions and effects of the present invention. The present disclosure may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. In the accompanying drawings, the components are shown enlarged for the sake of convenience of explanation, and the proportions of the components may be exaggerated or reduced for clarity of illustration.

Unless terms used in embodiments of the present invention are differently defined, the terms may be construed as meanings that are commonly known to a person skilled in the art. Hereinafter, the present disclosure will be described in detail by explaining preferred embodiments of the invention with reference to the accompanying drawings.

Figure 1A:
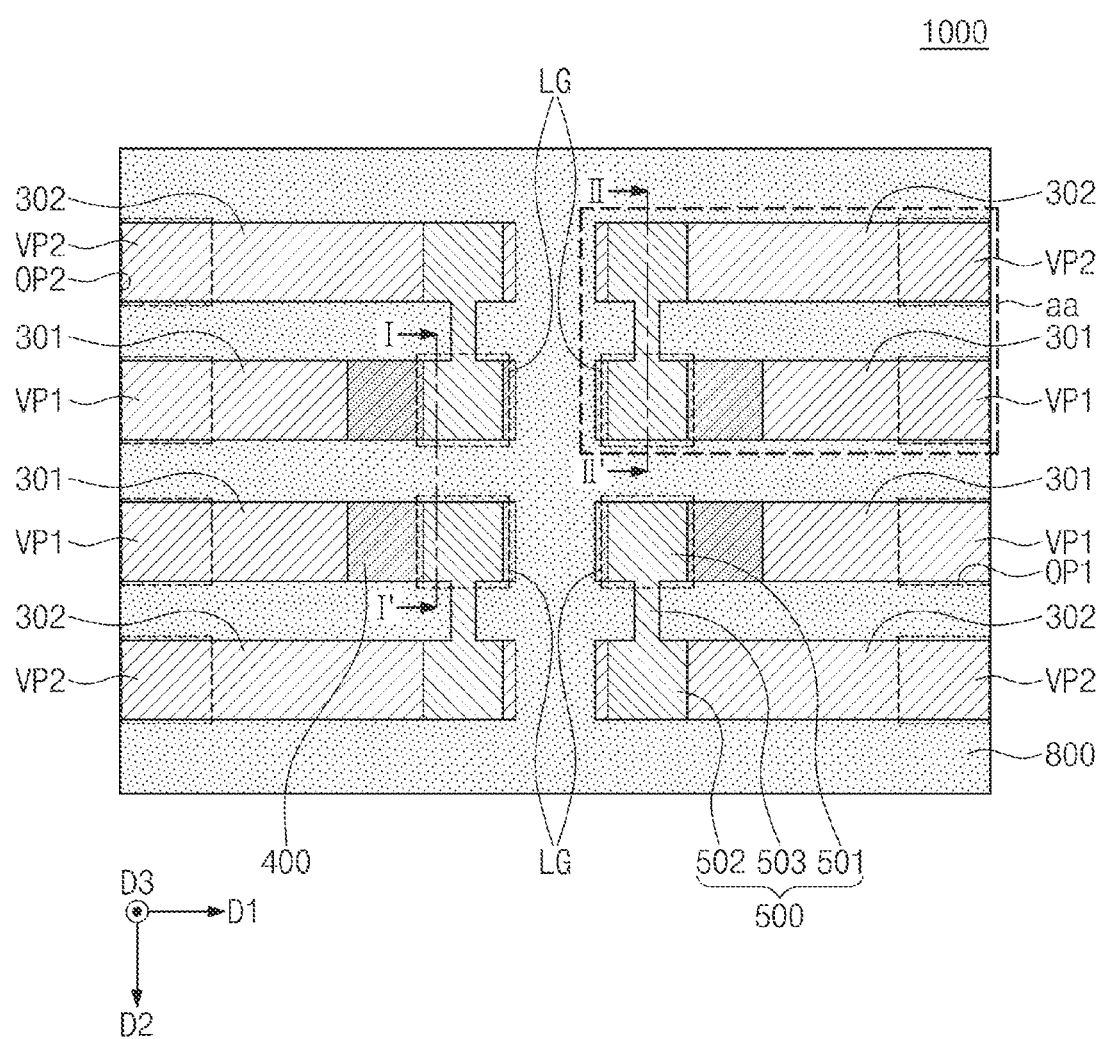
FIG. 1A is a plan view of a stretchable display device according to an embodiment of the inventive concept.
Figure 1B:
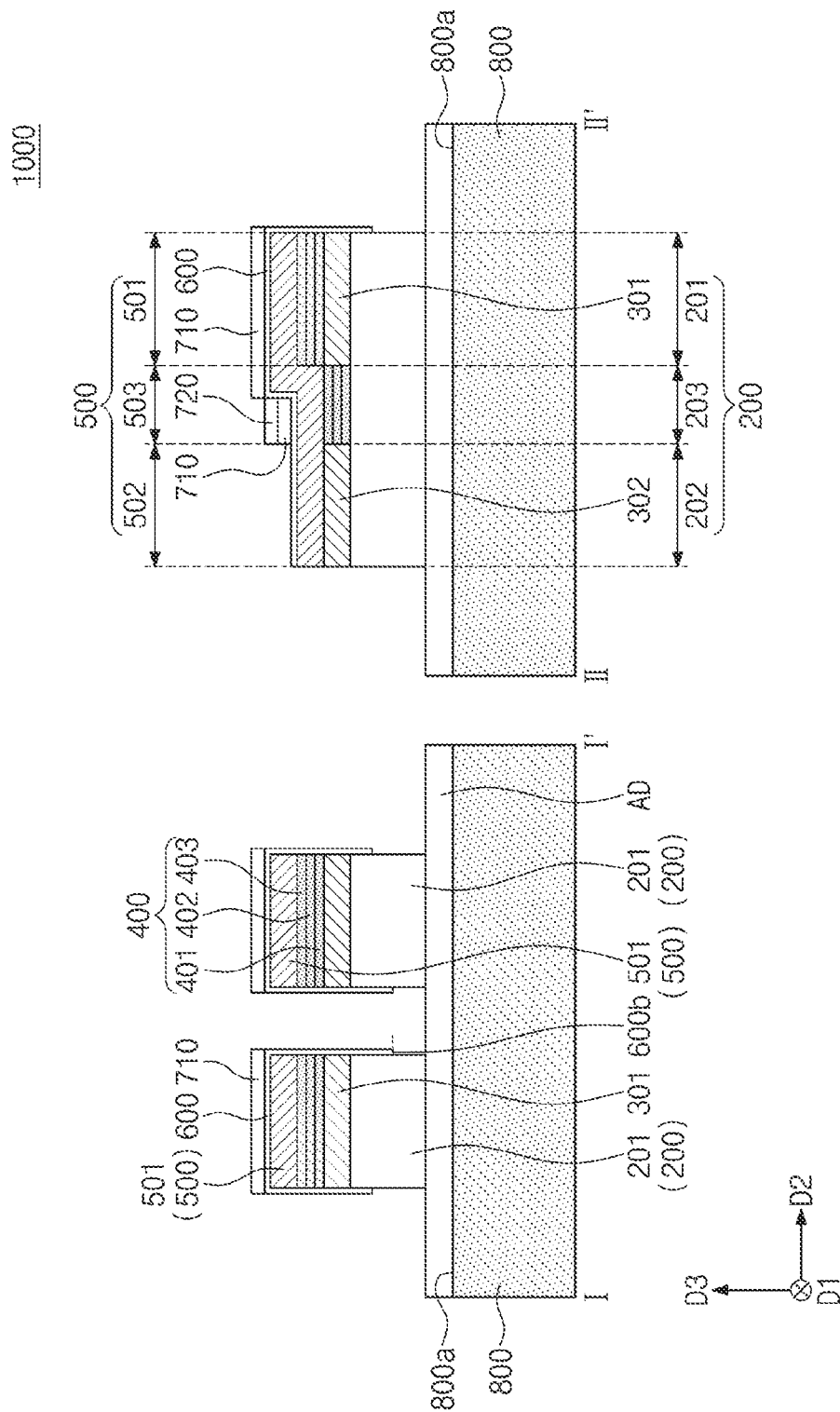
FIG. 1B is a cross-sectional view taken along line I-I' and II-II' of FIG. 1A.

FIG. 1A is a plan view of a stretchable display device according to an embodiment of the inventive concept. FIG. 1B is a cross-sectional view taken along line I-I' and II-II' of FIG. 1A. FIG. 1C is a plan view of a base pattern.

Referring to FIGS. 1A, 1B, and 1C, a stretchable display device 1000 according to an embodiment of the inventive concept may include a plurality of unit cells aa. Each of the unit cells aa may include a substrate 800, a base pattern 200, a first lower conductive pattern 301, a second lower conductive pattern 302, a light emitting structure 400, an upper conductive pattern 500, and a protective layer 600. The first lower conductive pattern 301, the second lower conductive pattern 302, the light emitting structure 400, the upper conductive pattern 500, and the protective layer 600 may constitute a light emitting element. The light emitting element may further include an organic layer 710 to be described later.

The substrate 800 may include, for example, any one of a glass substrate, a plastic substrate, and a stretchable substrate. An adhesive layer AD and the base pattern 200 may be sequentially provided on a top surface 800a of the substrate 800. According to some embodiments, the adhesive layer AD may be omitted, and the base pattern 200, the first lower conductive pattern 301, the second lower conductive pattern 302, the light emitting structure 400, and the upper conductive layer 500, and the protective layer 600 may be provided in the substrate 800 (see FIG. 11).

The base pattern 200 may include plastic. The base pattern 200 may include, for example, polyimide.

As illustrated in FIG. 1C, the base pattern 200 may include a first portion 201, a second portion 202, and a connection portion 203. The first portion 201 and the second portion 202 may extend in a first direction D1 parallel to the top surface 800a of the substrate 800. The first portion 201 and the second portion 202 may be parallel to the top surface 800a and spaced apart from each other in a second direction D2 crossing the first direction D1. The connection portion 203 may be provided between the first portion 201 and the second portion 202. The connection portion 203 may be integrally connected to the first portion 201 and the second portion 202. The connection portion 203 may extend in the second direction D2. The connection portion 203 may have a first width W1 in the first direction D1, and the second portion 202 may have a second width W2 in the second direction D2. The first width W1 may be less than the second width W2. The connection portion 203 may have a length L1 in the second direction D2, and the length L1 may be greater than the first width W1.

Although not shown, a buffer layer may be provided on the base pattern 200. The buffer layer may be a single layer or a multilayer thin film including silicon oxide (SiO$_x$), silicon nitride (SiN$_x$), aluminum oxide (AlO$_x$), parylene, or an organic-inorganic hybrid layer.

As illustrated in FIGS. 1A and 1B, the first lower conductive pattern 301 may be provided on the first portion 201 of the base pattern 200. The second lower conductive pattern 302 may be provided on the second portion 202 of the base pattern 200. Each of the first lower conductive pattern 301 and the second lower conductive pattern 302 may include any one of a metal and indium-tin-oxide (ITO). The first lower conductive pattern 301 and the second lower conductive pattern 302 may not overlap the connection portion 203 of the base pattern 200.

The light emitting structure 400 may be provided on the first lower conductive pattern 301. The light emitting structure 400 may include a hole transport layer 401, an organic emission layer 402, and an electron transport layer 403 that are sequentially laminated.

The light emitting structure 400 may be provided on the connection portion 203 of the base pattern 200. According to some embodiments, the light emitting structure 400 may not be provided on a top surface of the connection portion 203 of the base pattern 200. The light emitting structure 400 may not be provided on the second portion 202 of the base pattern 200.

That is, the light emitting structure 400 may be locally provided on only an area vertically overlapping the first lower conductive pattern 301, an area vertically overlapping the first lower conductive pattern 301, and an area vertically overlapping the connection portion 203 of the base pattern 200.

The upper conductive pattern 500 may include a first pattern portion 501, a second pattern portion 502, and a third pattern portion 503.

The first pattern portion 501 of the upper conductive pattern 500 may vertically overlap the first portion 201 of the base pattern 200 and may be vertically spaced apart from the first lower conductive pattern 301 with the light emitting structure 400 therebetween.

The second pattern portion 502 of the upper conductive pattern 500 may vertically overlap the second portion 202 of the base pattern 200. The second pattern portion 502 of the upper conductive pattern 500 may be in contact with the second lower conductive pattern 302. The third pattern portion 503 of the upper conductive pattern 500 may overlap the connection portion 203 of the base pattern 200. The third pattern portion 503 of the upper conductive pattern 500 may have substantially the same shape as the connection portion 203 of the base pattern 200 in view of plane.

The upper conductive pattern 500 may include a transparent conductive material. The transparent conductive material may include indium tin oxide (ITO), indium zinc oxide (IZO), or oxide-metal-oxide (OMO).

The first lower conductive pattern 301 and the upper conductive pattern 500 may serve as a lower electrode and an upper electrode, respectively. For example, the first lower conductive pattern 301 may serve as an anode, and the upper conductive pattern 500 may serve as a cathode. A voltage may be applied to the light emitting structure 400 due to a potential difference between the first lower conductive pattern 301 and the upper conductive pattern 500 to generate light. As illustrated in FIG. 1A, an area on which the first lower conductive pattern 301, the light emitting structure 400, and the upper conductive pattern 500 overlap each other may be an emission area LG.

The protective layer 600 may be provided on the upper conductive pattern 500. The protective layer 600 may extend to cover top and side surfaces of the upper conductive pattern 500, a side surface of the light emitting structure 400, and a portion of a side surface of the base pattern 200. The protective layer 600 may have a shape segmented between the first portion 201 and the second portion 202 of the base pattern 200. A level of the lowermost surface 600b of the protective layer 600 may be disposed between a level of a bottom surface of the first lower conductive pattern 301 (or a lower electrode) and a level of a bottom surface of the base pattern 301. The protective layer 600 may not be in contact with the substrate 800. The protective layer 600 may include an aluminum oxide (Al$_2$O$_3$) layer, a parylene layer, or a laminated structure thereof.

The protective layer 600 may include first openings OP1 and second openings OP2 as illustrated in FIG. 1A. Each of the first openings OP1 may expose a portion of the first lower conductive pattern 301. The exposed portion of the first lower conductive pattern 301 may be a first power pad VP1 to which a first voltage is applied.

Each of the second openings OP2 may expose a portion of the second lower conductive pattern 302. The exposed portion of the second lower conductive pattern 302 may be a second power pad VP2 to which a second voltage is applied. According to an embodiment of the inventive concept, the first power pad VP1 and the second power pad VP2 may not overlap each other. Also, the first power pad VP1 and the second power pad VP2 may not overlap the light emitting structure 400. The second pattern portion 502 of the upper conductive pattern 500 may be in contact with the second lower conductive pattern 302. The second pattern portion 502 of the upper conductive pattern 500 may receive power from the second power pad VP2 to apply a voltage to the first pattern portion 501 through the third pattern portion 503.

An organic layer 710 may be provided on the protective layer 600, and the organic layer 710 may also be referred to as a first sacrificial layer 710. The first sacrificial layer 710 may be in contact with the protective layer 600. The first sacrificial layer 710 may vertically overlap the first portion 201 of the base pattern 200. The first sacrificial layer 710 may not vertically overlap the second portion 202 of the base pattern 200. The first sacrificial layer 710 may be additionally provided on the connection portion 203 of the base pattern 200.

The first sacrificial layer 710 may have a thickness of about 100 Å to about 1,000 Å. The first sacrificial layer 710 may include an organic material. The first sacrificial layer 710 may include any one of tris(8-hydroxyquinolinato) aluminum (Alq3), 1,3,5-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis(benzoquinolin-10-olate (Bebq2), 9,10-di(naphthalen-2-yl)anthracene (ADN), and a mixture thereof.

A metal layer 720 may be provided on the first sacrificial layer 710. The metal layer 720 may also be referred to as a second sacrificial layer 720. The second sacrificial layer 720 may be locally provided on the first sacrificial layer 710 that vertically overlaps the connection portion 203 of the base pattern. According to some embodiments, the second sacrificial layer 720 may be omitted.

The second sacrificial layer 720 may have a thickness of about 100 Å to about 1,000 Å. The second sacrificial layer 720 may include a metal. The second sacrificial layer 720 may be, for example, any one of a metal layer such as gold, silver, titanium, molybdenum, or aluminum.

As described above, in the stretchable display device according to an embodiment of the inventive concept, the light emitting structure 400 and the upper conductive pattern 500 may be provided on only the base pattern 200. As a result, a surface areas of the light emitting structure 400 and the upper conductive pattern 500 on the remaining areas except for the emission area LG may be reduced to improve overall transmittance of the stretchable display device. In addition, since the protective layer covers the side surface of the light emitting structure to protect the light emitting structure, the stretchable display device may be improved in reliability.

FIGS. 2A to 7A are plan views illustrating a process of manufacturing the stretchable display device according to some embodiments of the inventive concept. FIGS. 2B to 7B are cross-sectional views taken along line I-I' and II-II' of FIGS. 2A to 7A.

Referring to FIGS. 2A and 2B, a carrier substrate 100 may be provided. The carrier substrate 100 may be various substrates such as a glass substrate, a plastic substrate, and a silicon substrate.

A base substrate 200L may be provided on the carrier substrate 100. The base substrate 200L may include plastic, for example, may include polyimide.

A lower conductive layer 300L may be formed on the base substrate 200L. The lower conductive layer 300L may include a metal material or a transparent conductive material. According to some embodiments, a buffer layer may be formed on the base substrate 200L before the lower conductive layer 300L is formed.

Figure 3B:
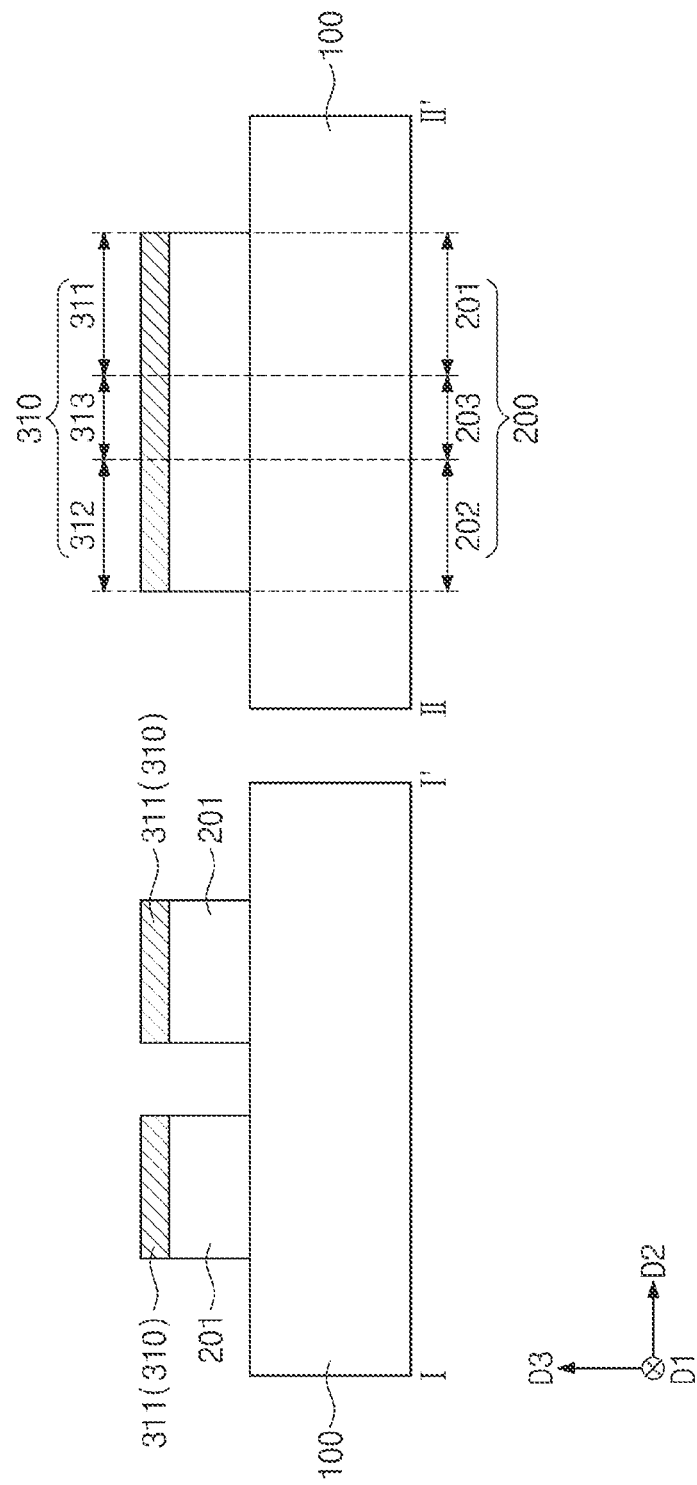

Referring to FIGS. 3A and 3B, the lower conductive layer 300L may be patterned to form a lower conductive structure 310. Particularly, a photo mask pattern may be formed on the lower conductive layer 300L through formation, exposure, and patterning of a photoresist layer. The lower conductive structures 310 may be formed using the photo mask pattern as an etching mask. Each of the lower conductive structures 310 may include a first portion 311 and a second portion 312, which extend in the first direction, and a connection portion 313 between the first portion 311 and the second portion 312.

Subsequently, the buffer layer and the base substrate 200L may be sequentially etched using the lower conductive structure 310 as the etching mask. The base substrate 200L may be etched to form a base pattern 200. Simultaneously, a first portion 201, a second portion 202, and a connection portion 203 of the base pattern 200 may be formed. The planar shapes of the first portion 201, the second portion 202 and the connection portion 203 of the base pattern 200 may be substantially the same as those of the first portion 311, the second portion 312 and the connection portion of the lower conductive structure 310.

Figure 4B:
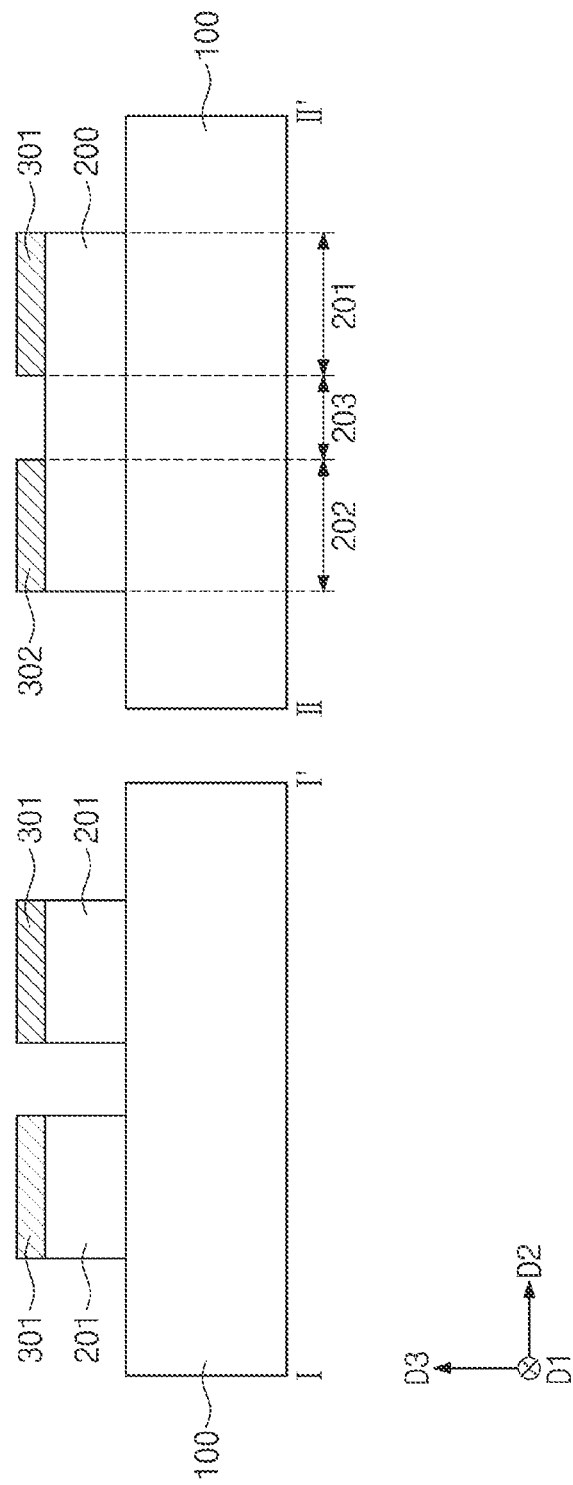

Referring to FIGS. 4A and 4B, the connection portion 313 of the lower conductive structure 310 may be selectively removed. A process of removing the connection portion 313 of the lower conductive structure 310 may be performed through an etching process. As a result, the connection portion 203 of the base pattern 200 may be exposed. The first portion 311 and the second portion 312 of the lower conductive structure 310 of FIGS. 3A and 3B may be a first lower conductive pattern 301 and a second lower conductive pattern 302, respectively.

Figure 5B:
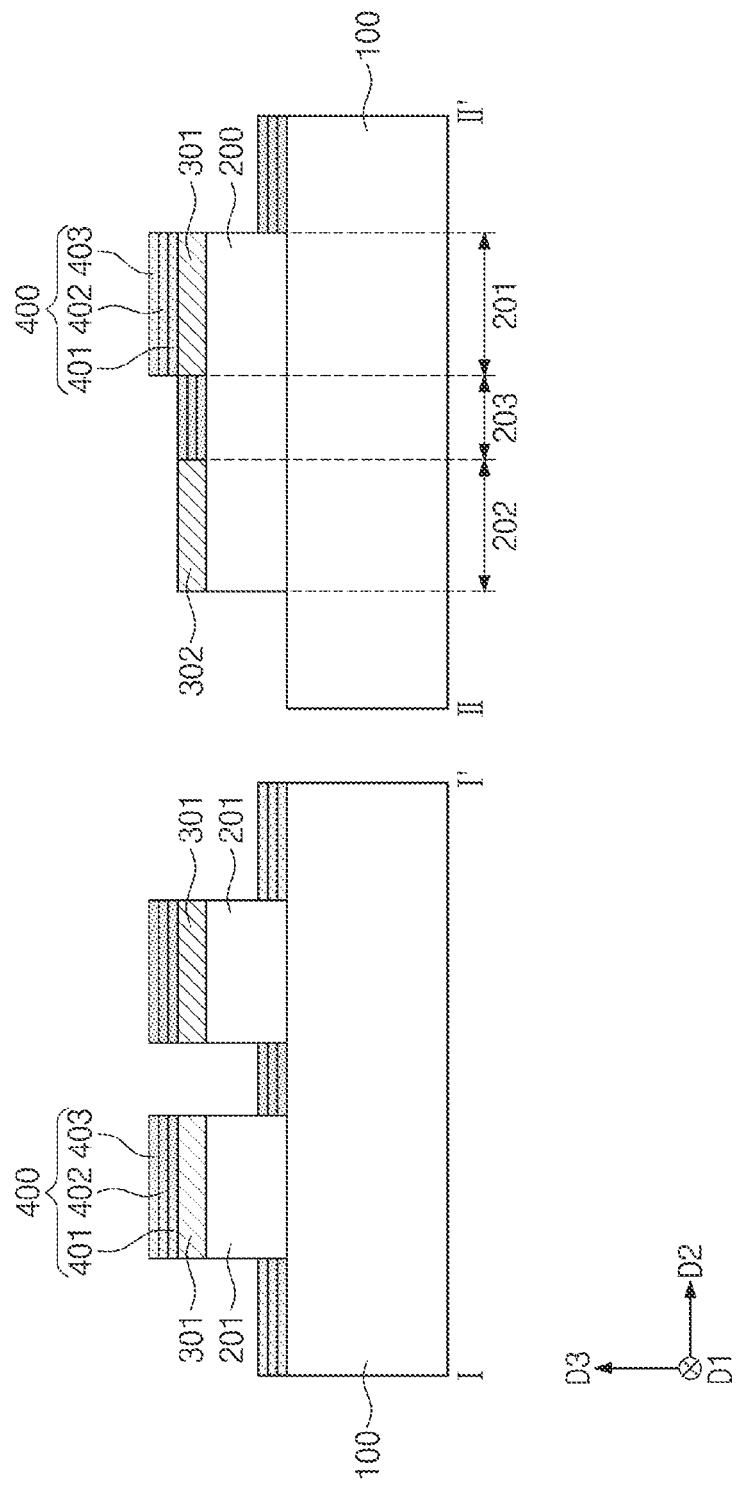

Referring to FIGS. 5A and 5B, a light emitting structure 400 may be formed on the first lower conductive pattern 301. Particularly, a hole transport layer 401, an organic emission layer 402, and an electron transport layer 403 may be sequentially formed. Additionally, the light emitting structure 400 may also be formed on a top surface of the connection portion 203 of the base pattern 200 and a top surface of the carrier substrate 100. The light emitting structure 400 may not be formed on the second portion 202 of the base pattern 200.

Figure 6A:
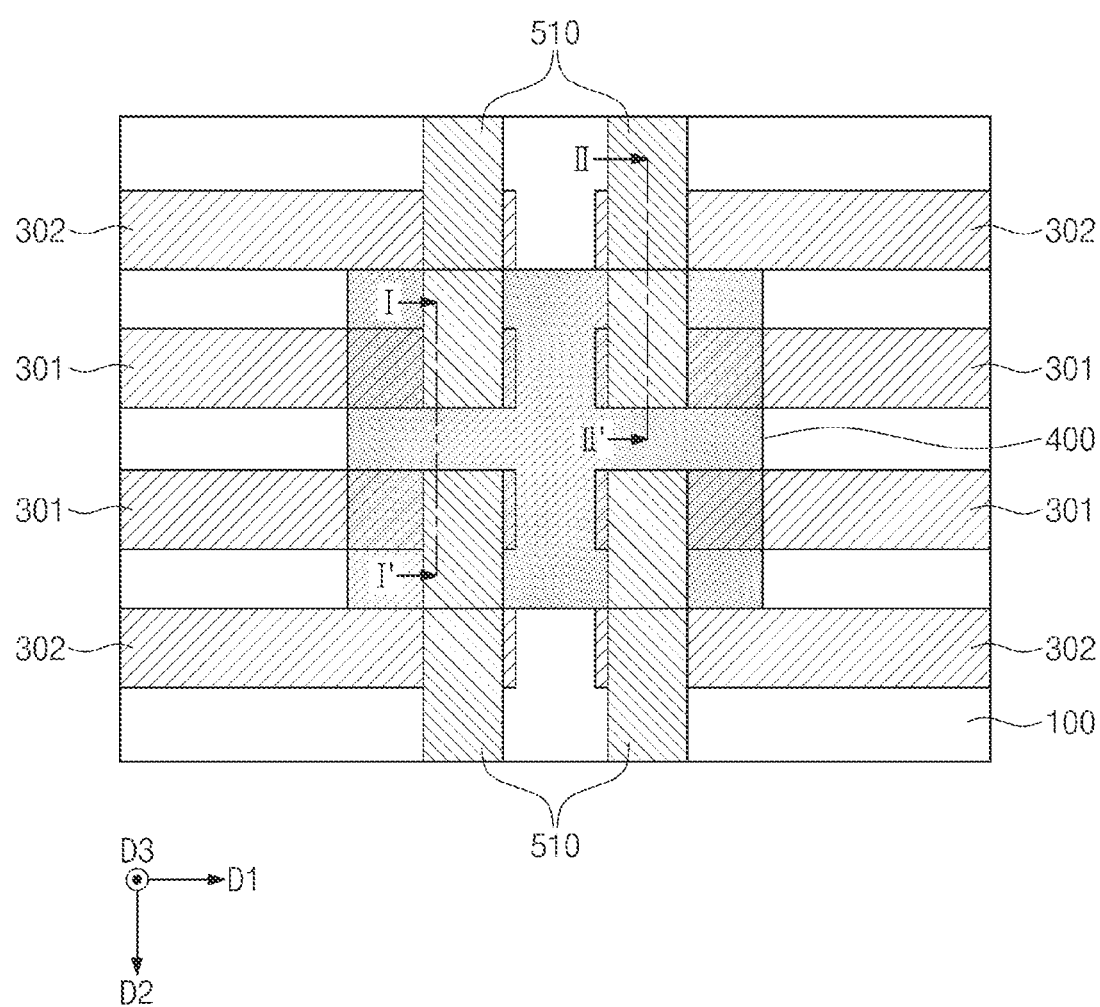
Figure 6B:
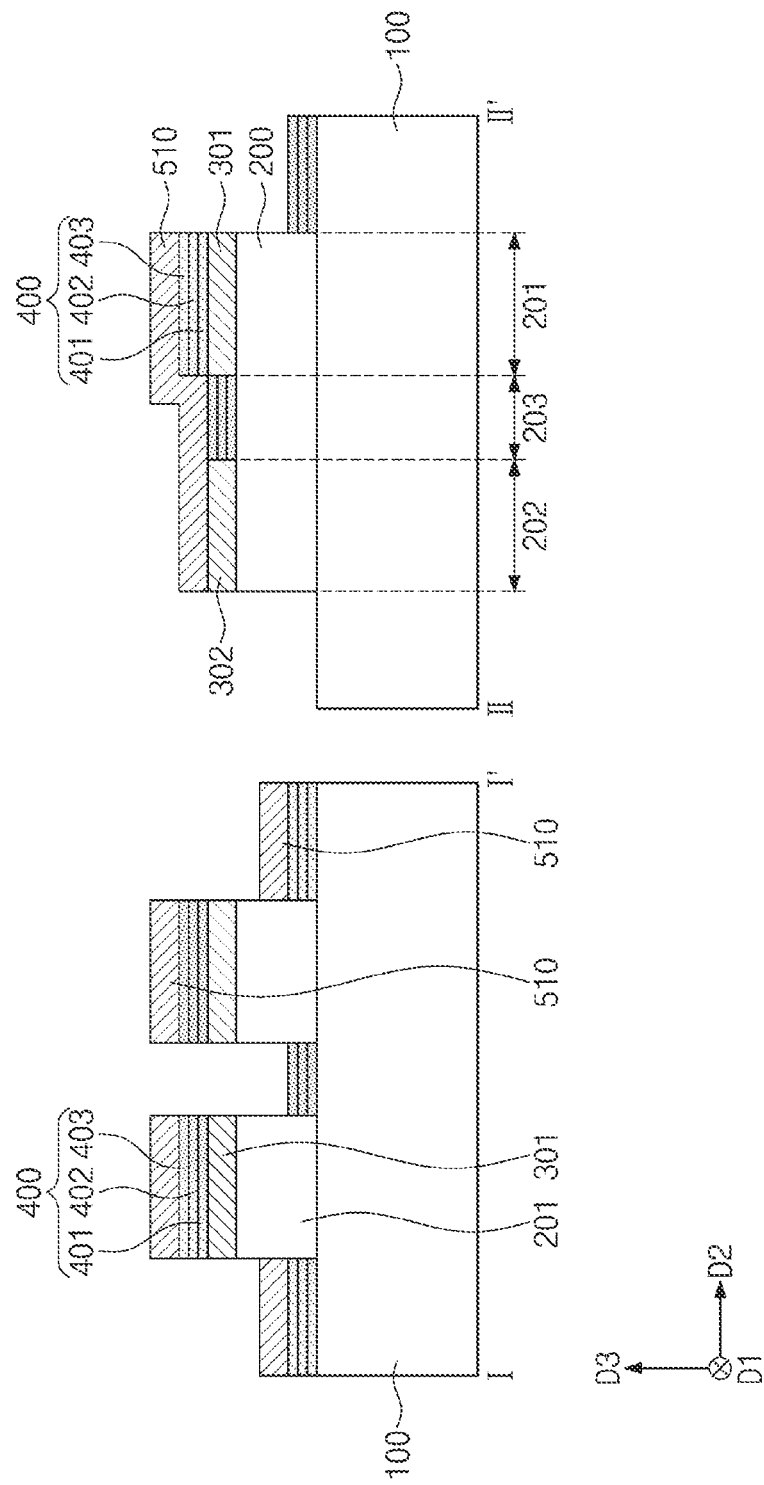

Referring to FIGS. 6A and 6B, upper conductive lines 510 may be formed. The upper conductive lines 510 may extend in the second direction D2. Each of the upper conductive lines 510 may be formed on the first lower conductive pattern 301, the second lower conductive pattern 302, and the connection portion 203 of the base pattern 200. The upper conductive lines 510 may be vertically spaced apart from each other with the first lower conductive pattern 301 and the light emitting structure 400 therebetween. The upper conductive lines 510 may be in contact with the second lower conductive pattern 302. Each of the upper conductive lines 510 may include a transparent conductive material.

Figure 7A:
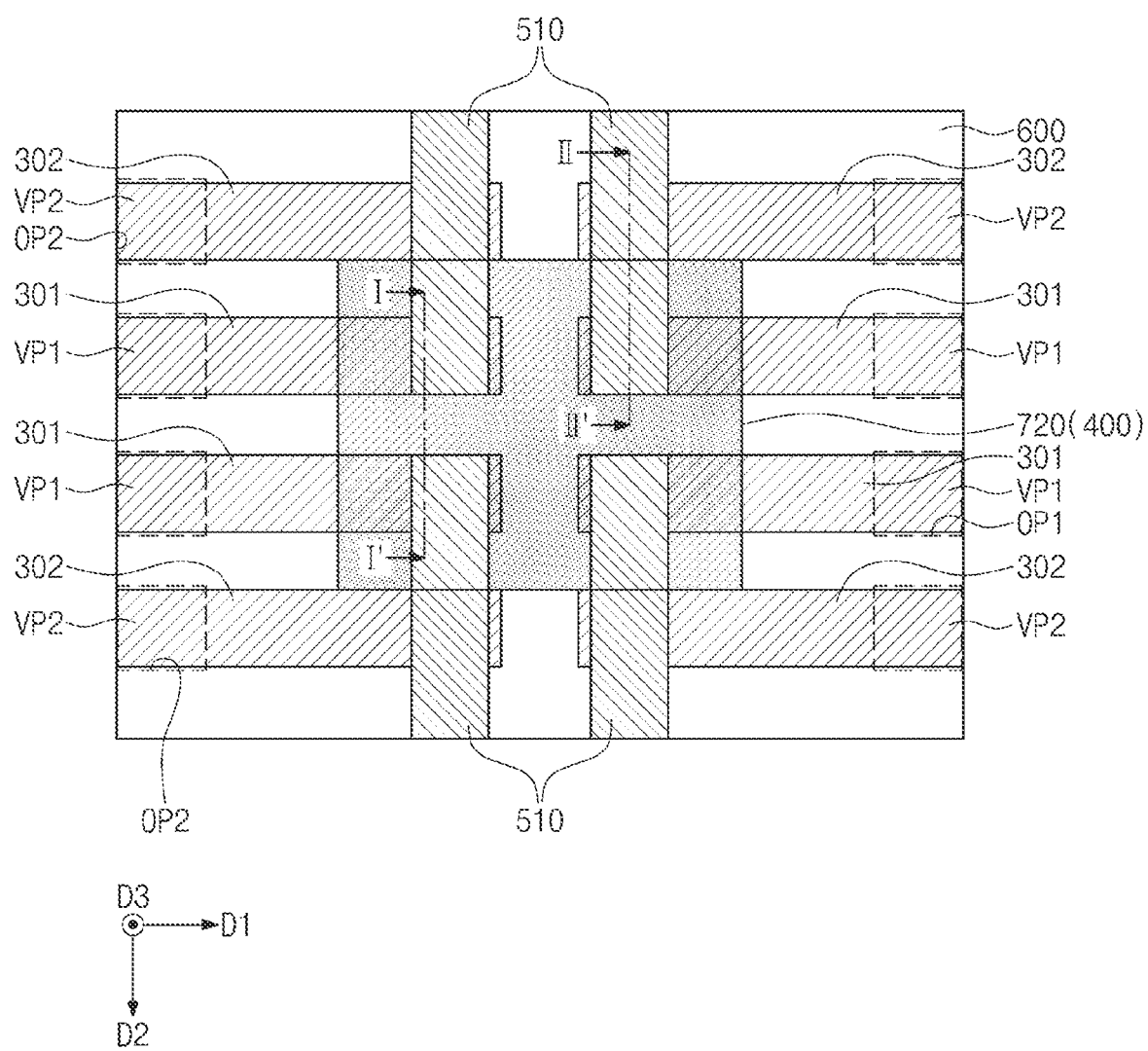
Figure 7B:
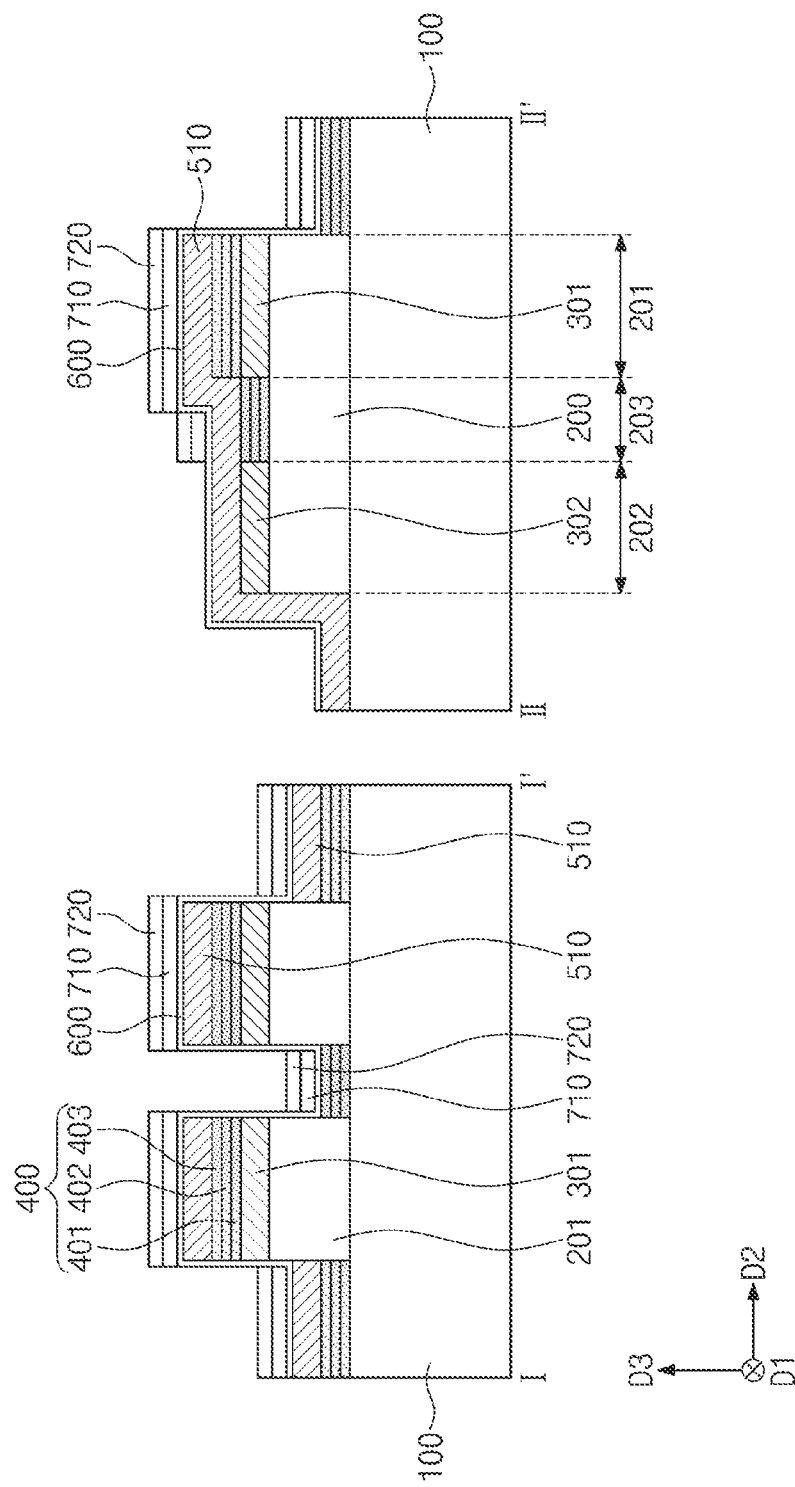

Referring to FIGS. 7A and 7B, the protective layer 600 that covers top and side surfaces of the upper conductive lines 510, a side surface of the light emitting structure 400, a side surface of the lower conductive patterns 301 and 302, a portion of a side surface of the base pattern, and a top surface of the carrier substrate 100 may be conformally formed. The protective layer 600 may include first openings OP1 exposing a portion of the first lower conductive pattern 301 and second openings OP2 exposing a portion of the second lower conductive pattern 302. The exposed portion of the first lower conductive pattern 301 may function as a first power pad VP1, and the exposed portion of the second lower conductive pattern 302 may function as a second power pad VP2.

The protective layer 600 may be formed, for example, through an atomic layer deposition process. Subsequently, a first sacrificial layer 710 and a second sacrificial layer 720 may be sequentially formed on the protective layer 600. The first sacrificial layer 710 and the second sacrificial layer 720 may be formed on a formation area of the light emitting structure 400. According to some embodiments, the first sacrificial layer 710 and the second sacrificial layer 720 may be locally formed on an area on which the upper conductive lines 510 and the light emitting structure 400 overlap each other.

Subsequently, referring to FIG. 8, a detachable film 900 may be provided to be in contact with the second sacrificial layer 720. The detachable film 900 may have adhesive force within about 1.3 N/10 mm.

Figure 8:
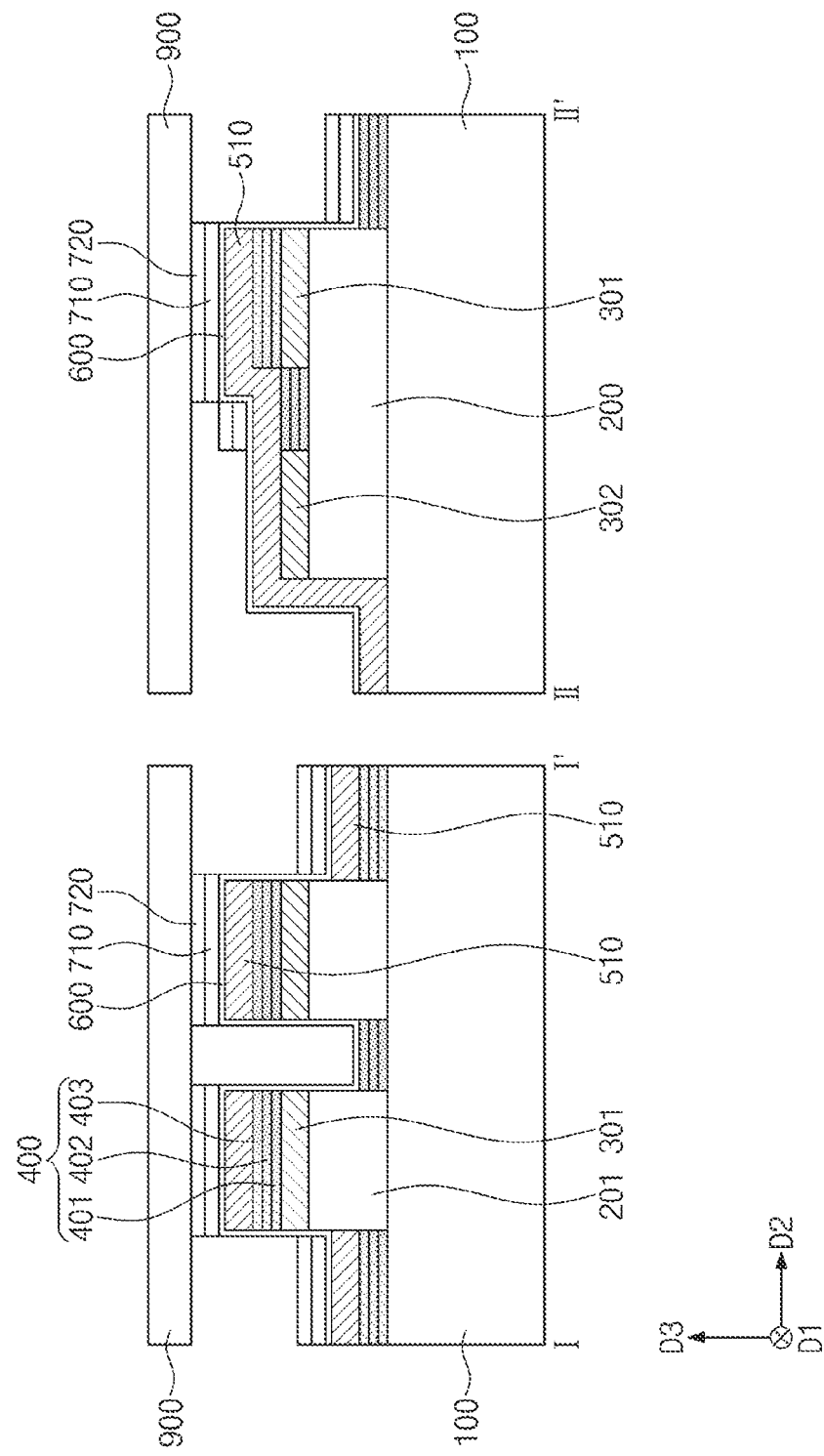
FIGS. 8 to 10 are cross-sectional views for explaining a method for transferring a base pattern and elements on the base pattern according to embodiments of the inventive concept.
Figure 9:
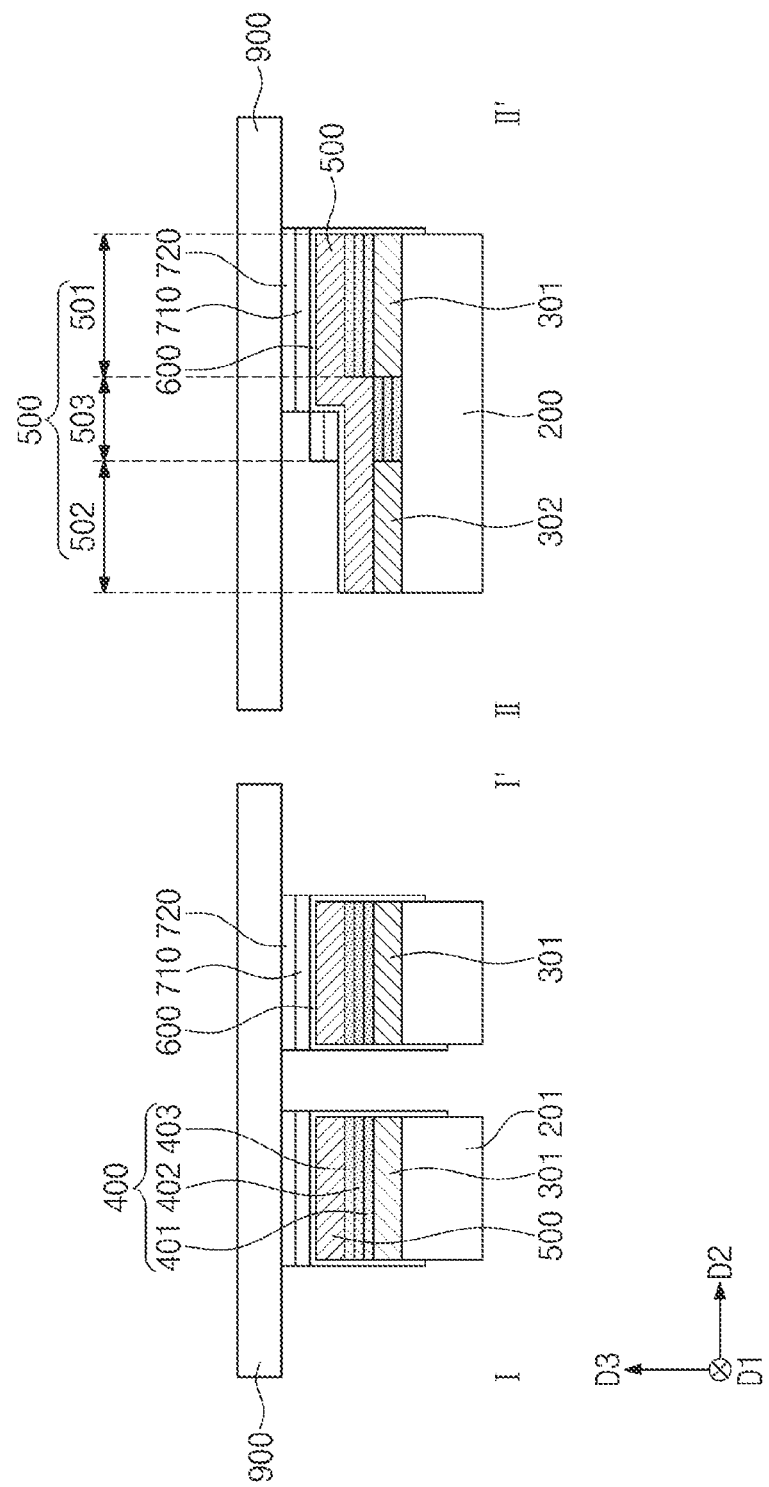
Figure 10:
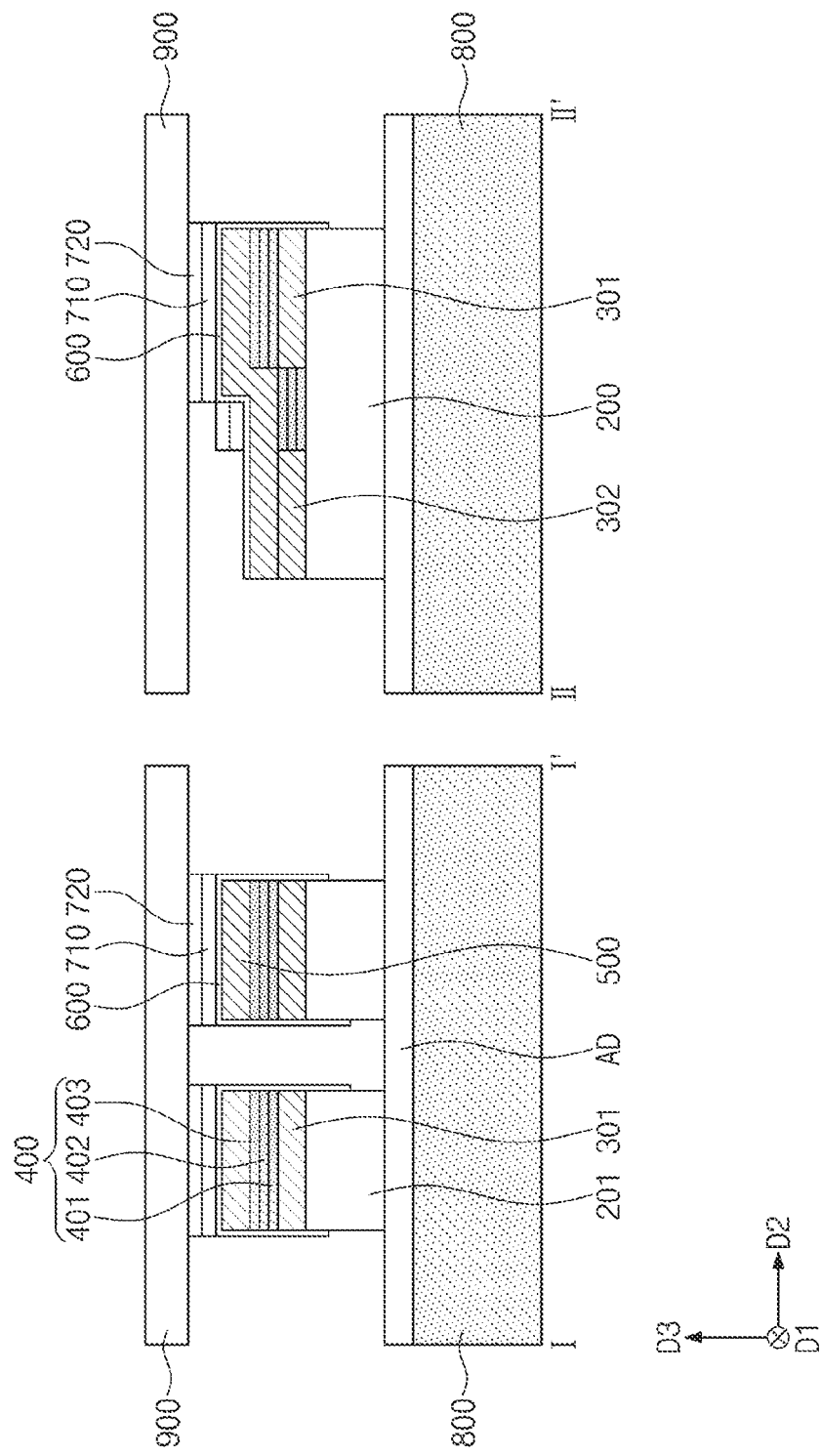

FIGS. 8 to 10 are cross-sectional views for explaining a method for transferring a base pattern and elements on the base pattern according to embodiments of the inventive concept.

Referring to FIGS. 8 and 9, the carrier substrate 100 and the base pattern 200 may be separated from each other using a laser lift off (LLO) process. The first and second lower conductive patterns 301 and 302 on the base pattern 200, the light emitting structure 400, the upper conductive pattern 500, the protective layer 600, the first sacrificial layer 710, and the second sacrificial layer 720 may move together with the detachable film 900. A portion of the upper conductive line 510, which does not vertically overlap the base pattern 200, the light emitting structure 400, the protective layer 600, the first sacrificial layer 710, and the second sacrificial layer 720 may be removed.

Since only a portion of the upper conductive line 510 provided on the base pattern 200 remains, the upper conductive pattern 500 may be formed. Simultaneously, a first pattern portion 501, a second pattern portion 502, and a third pattern portion 503 of the upper conductive pattern 500 may be formed.

Referring to FIG. 10, the base pattern 200 may be attached on an adhesive layer AD provided on the substrate 800. Referring again to FIG. 1B, the detachable film 900 may be removed. While the detachable film 900 is removed, the second sacrificial layer 720 may also be removed. The adhesive force between the base pattern 200 and the substrate 800 may be stronger than that between the second sacrificial layer 720 and the detachable film 900. The adhesive force between the first sacrificial layer 710 and the second sacrificial layer 720 may be weaker than that between the second sacrificial layer 720 and the detachable film 900.

In the case of the existing process, when attaching the detachable film 900 to the upper conductive line 510 without the first sacrificial layer 710 and the second sacrificial layer 720, the upper conductive pattern 300 may be delaminated from the light emitting structure while removing the detachable film 900. According to an embodiment of the inventive concept, the first sacrificial layer 710 and the second sacrificial layer 720 may be used to allow the upper conductive pattern 300 to remain without being damaged.

Figure 11:
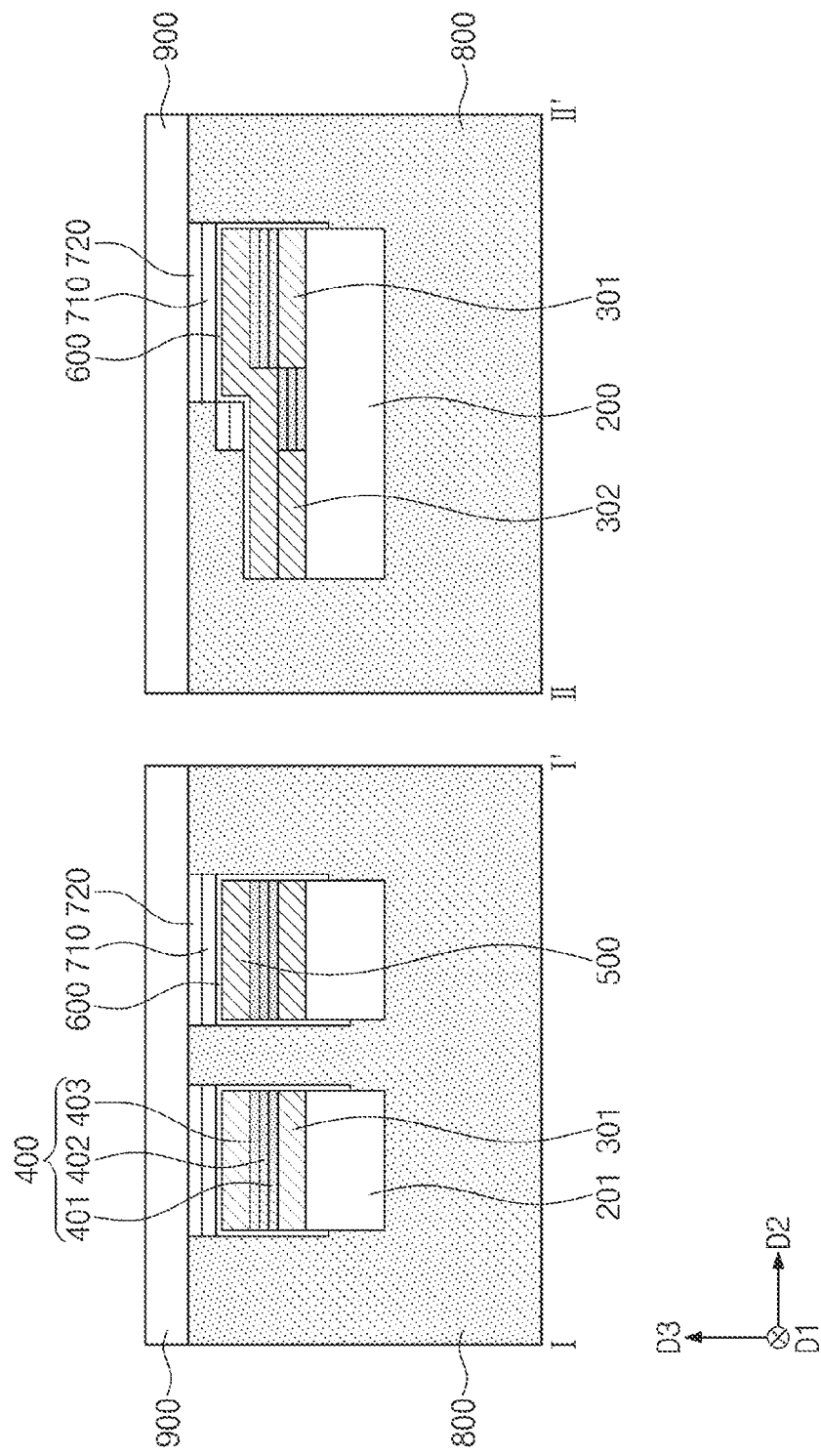
FIG. 11 is a cross-sectional view for explaining a method for transferring a base pattern and a light emitting element according to some embodiments of the inventive concept.

FIG. 11 is a cross-sectional view for explaining a method for transferring the base pattern and the light emitting element according to some embodiments of the inventive concept.

Referring to FIGS. 9 and 11, the adhesive layer AD may be omitted, and the base pattern 200 may be directly attached to the substrate 800. When the substrate 800 is made of a material having an adhesive property, the base pattern 200 and elements on the base pattern 200 may be impregnated in the substrate 800.

Figure 12A:
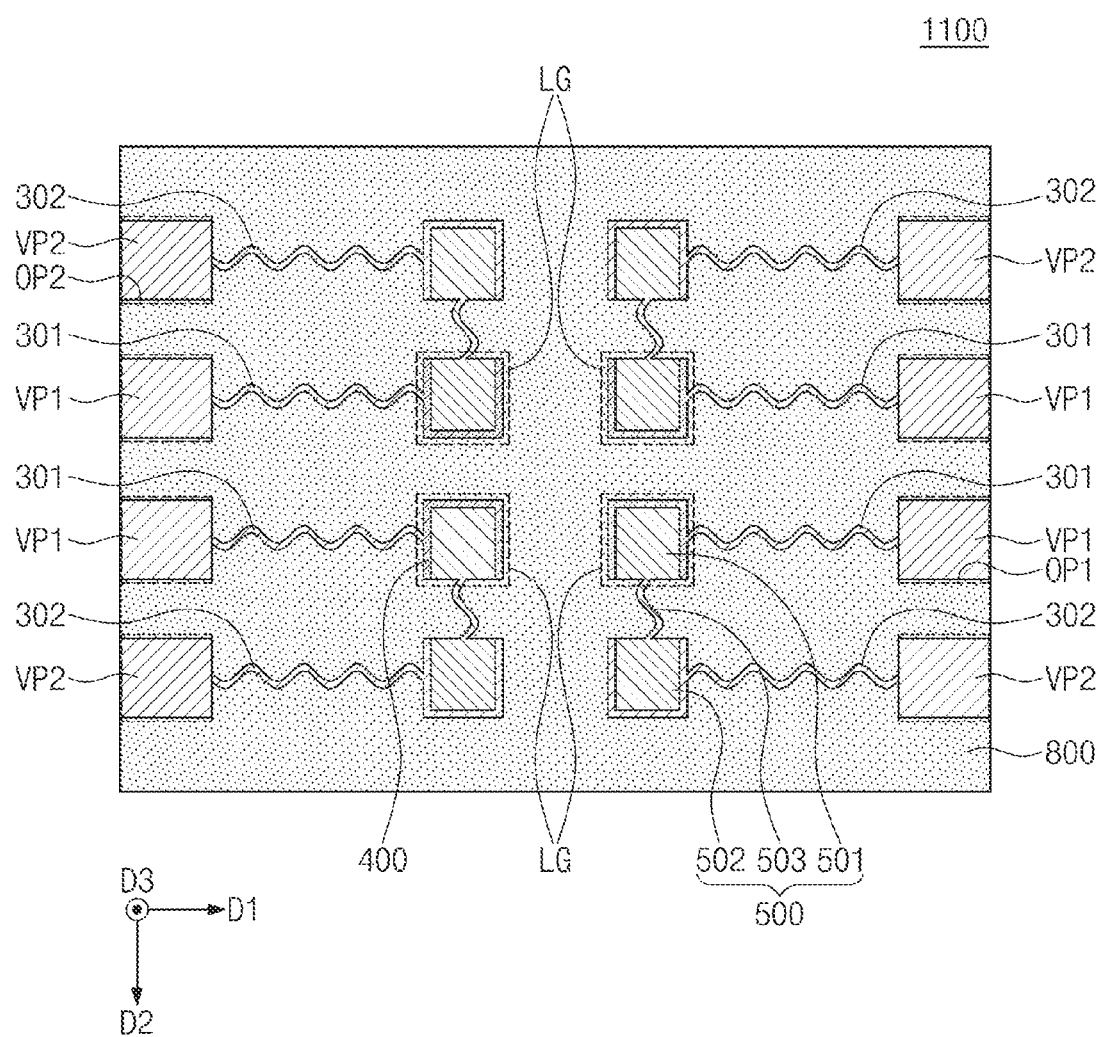
FIG. 12A is a plan view of a stretchable display device according to some embodiments of the inventive concept.

FIG. 12A is a plan view of a stretchable display device according to some embodiments of the inventive concept. FIG. 12B is a schematic plan view illustrating a base pattern of FIG. 12A. Since the above-described contents have been described in FIGS. 1A to 1C except for following contents to be described below, the duplicated contents will be omitted.

Referring to FIGS. 12A and 12B, a stretchable display device 1100 according to some embodiments may include a base pattern 200 having a serpentine shape.

As illustrated in FIG. 12B, the base pattern 200 may include a first portion 201, a second portion 202, and a connection portion 203. The first portion 201 may include a first electrode support 201E, a first power pad support 201P, and a first line support 201L connecting the first electrode support 201E to the first power pad support 201P, which are spaced apart from each other in the first direction D1. The second portion 202 may include a contact support 202E, a second power pad support 202P, and a second line support 202L connecting the contact support 202E to the second power pad support 202P, which are spaced apart from each other in the first direction D1. At least one of the first wire support 201L, the second wire support 202L, or the connection portion 203 may extend in a serpentine shape.

A first lower conductive pattern 301 may be provided on the first portion 201 of the base pattern 200. The first lower conductive pattern 301 may include a portion (lower electrode) vertically overlapping a light emitting structure 400, a first power pad VP1, and a first line portion connecting the lower electrode to the first power pad VP1.

The planar shape of the portion (lower electrode) that vertically overlaps the light emitting structure 400, the first power pad VP1, and the first line portion may be substantially the same as those of the first electrode support 201E, the first power pad 201P, and the first line support 201L of the first portion 202 of the base pattern 200, respectively.

The second lower conductive pattern 302 may be provided on the second portion 202 of the base pattern 200. The second lower conductive pattern 302 may include a portion vertically overlapping the upper conductive pattern 500, a second power pad VP2, and a second line portion connecting the portion vertically overlapping the upper conductive pattern 500 to the second power pad VP2. The planar shape of the portion vertically overlapping the upper conductive pattern 500, the second power pad VP2, and the second wiring portion may be substantially the same as those of the contact support 202E, the second power pad support 202P, and the second line support 202L of the second portion 202 of the base pattern 200.

A first pattern portion 501 of the upper conductive pattern 500 may be provided on the first electrode support 201E of the base pattern 200. A second pattern portion 502 of the upper conductive pattern 500 may be provided on the contact support portion 202E of the base pattern 200. A third pattern portion 503 of the upper conductive pattern 500 may be provided on the connection portion 203 of the base pattern 200. The planar shape of the third pattern portion 503 of the upper conductive pattern 500 may be substantially the same as that of the connection portion 203 of the base pattern 200. The second conductive pattern portion 502 of the upper conductive pattern 500 may be in contact with the second lower conductive pattern 302.

According to an embodiment of the inventive concept, since each of the base pattern 200 and the conductive patterns 301, 302, and 500 provided on the base pattern 200 has the serpentine shape, if a pressure is applied to the substrate 800 to be elongated, the base pattern 200 and the conductive patterns 301, 302, and 500 may be elongated without being damaged to improve the reliability of the stretchable display device.

According to some embodiments, a common connection portion may be provided between adjacent base patterns 200, and the conductive patterns 301, 302, and 500 may extend to be provided on the common connection portion.

In the stretchable display device according to the embodiment of the inventive concept, the light emitting structure and the upper electrode may be provided on only the base pattern. As a result, the surface areas of the light emitting structure and the upper electrode on the remaining areas except for the emission area may be reduced to improve the overall transmittance of the stretchable display device. In addition, since the protective layer covers the side surface of the light emitting structure to protect the light emitting structure, the stretchable display device may be improved in reliability.

In the above, the embodiments of the inventive concept have been described with reference to the accompanying drawings, but the present disclosure may be implemented in other specific forms without changing the technical spirit or essential features. Therefore, it should be understood that the above-disclosed embodiments are to be considered illustrative and not restrictive.

What is claimed is:

1. A stretchable display device comprising:
a substrate; and
a base pattern on the substrate, wherein the base pattern comprises a first portion, a second portion, and a connection portion configured to connect the first portion to the second portion;
a lower electrode on the first portion of the base pattern;
an upper electrode on the lower electrode;
a light emitting structure between the lower electrode and the upper electrode; and
a protective layer configured to cover top and side surfaces of the upper electrode, side surfaces of the light emitting structure, a side surface of the lower electrode, and a portion of a side surface of the base pattern,
wherein the upper electrode extends to a top surface of the connection portion and a top surface of the second portion of the base pattern,
the first portion and the second portion of the base pattern extend in a first direction parallel to a top surface of the substrate,
the first portion and the second portion are parallel to the top surface of the substrate and are spaced apart from each other in a second direction crossing the first direction,
the connection portion extends in the second direction, and
a level of the lowermost surface of the protective layer is disposed between a bottom surface of the lower electrode and a bottom surface of the base pattern.

2. The stretchable display device of claim 1, wherein the lower electrode is connected to a first power pad on the first portion of the base pattern,
the upper electrode is connected to a second power pad on the second portion of the base pattern, and
the first power pad and the second power pad are exposed from the protective layer.

3. The stretchable display device of claim 2, wherein the first power pad, the second power pad, and the light emitting structure do not overlap each other.

4. The stretchable display device of claim 2, wherein the connection portion of the base pattern has a first width in the first direction, and
the second portion of the base pattern has a second width in the second direction,
wherein the first width is less than the second width.

5. The stretchable display device of claim 1, wherein the base pattern comprises polyimide.

6. The stretchable display device of claim 1, further comprising an organic layer on the protective layer,
wherein the organic layer vertically overlaps the first portion of the base pattern, and
the protective layer and the organic layer comprise materials different from each other.

7. The stretchable display device of claim 6, wherein the protective layer comprises any one of an aluminum oxide ($Al_2O_3$) layer, a parylene layer, or a laminated structure thereof.

8. The stretchable display device of claim 6, wherein the organic layer comprises any one of tris(8-hydroxyquinolinato)aluminum (Alq3), 1,3,5-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis(benzoquinolin-10-olate (Bebq2), 9,10-di(naphthalene-2-yl)anthracene (ADN), and a mixture thereof.

9. The stretchable display device of claim 1, wherein the protective layer has a shape that is segmented between the first portion and the second portion of the base pattern.

10. A stretchable display device comprising:
a substrate;
a base pattern on the substrate, wherein the base pattern comprises a first portion, a second portion, and a connection portion configured to connect the first portion to the second portion; and
a light emitting element on the base pattern,
wherein the light emitting element comprises:
a first lower conductive pattern on the first portion of the base pattern;
a second lower conductive pattern on the second portion of the base pattern;

a light emitting structure on the first lower conductive pattern;

an upper conductive pattern on the first lower conductive pattern; and a protective layer configured to cover the light emitting element, wherein the upper conductive pattern extends onto the connection portion and the second portion of the base pattern, and the protective layer has a shape that is segmented between the first portion and the second portion of the base pattern.

11. The stretchable display device of claim 10, wherein the light emitting structure is locally provided on the first portion and the connection portion of the base pattern, and the light emitting structure does not vertically overlap the second portion of the base pattern.

12. The stretchable display device of claim 10, wherein the upper conductive pattern comprises a first pattern portion, a second pattern portion, and a third pattern portion configured to connect the first pattern portion to the second pattern portion, the third pattern portion of the upper conductive pattern vertically overlaps the connection portion of the base pattern, and in view of plane, the third pattern portion of the upper conductive pattern and the connection portion of the base pattern have substantially the same.

13. The stretchable display device of claim 12, wherein the first pattern portion of the upper conductive pattern is in contact with the light emitting structure, and the second pattern portion of the upper conductive pattern is in contact with the first lower conductive pattern.

14. The stretchable display device of claim 12, wherein each of the connection portion of the base pattern and the third portion of the upper conductive pattern has a serpentine shape.

15. The stretchable display device of claim 10, wherein the first portion of the base pattern comprises a first electrode support, a first power pad support, and a first line support configured to connect the first electrode support to the first power pad support, the second portion of the base pattern comprises a contact support, a second power pad support, and a second line support configured to connect the contact support to the second power pad support, the first lower conductive pattern comprises a first line on the first line support, the second lower conductive pattern comprises a second line on the second line support, and each of the first and second line supports and the first and second lines has a serpentine shape.

16. The stretchable display device of claim 10, wherein the upper conductive pattern and the light emitting structure are provided on only a portion that vertically overlaps the base pattern.

17. The stretchable display device of claim 10, wherein the base pattern comprises polyimide.

18. The stretchable display device of claim 10, wherein the light emitting structure comprises a hole transport layer, an organic emission layer, and an electron transport layer, which are sequentially laminated.

19. The stretchable display device of claim 10, further comprising an organic layer on the protective layer, wherein the organic layer vertically overlaps the first portion of the base pattern, and the protective layer and the organic layer comprise materials different from each other.

20. The stretchable display device of claim 19, wherein the protective layer comprises any one of an aluminum oxide (Al2O3) layer, a parylene layer, or a laminated structure thereof, and the organic layer comprises any one of tris(8-hydroxyquinolinato)aluminum (Alq3), 1,3,5-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis(benzoquinolin-10-olate (Bebq2), 9,10-di(naphthalene-2-yl)anthracene (ADN), and a mixture thereof.

* * * * *